(12) United States Patent
Jeong et al.

(10) Patent No.: US 10,720,198 B1
(45) Date of Patent: Jul. 21, 2020

(54) SEMICONDUCTOR DEVICE

(71) Applicant: SK hynix Inc., Icheon-si (KR)

(72) Inventors: Young Mok Jeong, Suwon-si (KR); Seok Bo Shim, Hwaseong-si (KR)

(*) Notice: Subject to any disclaimer, the term of this patent is extended or adjusted under 35 U.S.C. 154(b) by 0 days.

(21) Appl. No.: 16/512,192

(22) Filed: Jul. 15, 2019

(30) Foreign Application Priority Data

Jan. 8, 2019 (KR) ........................ 10-2019-0002384

(51) Int. Cl.
G11C 7/22 (2006.01)
G11C 8/18 (2006.01)
G11C 7/10 (2006.01)

(52) U.S. Cl.
CPC ............ *G11C 7/222* (2013.01); *G11C 7/1066* (2013.01); *G11C 7/1087* (2013.01); *G11C 7/1093* (2013.01); *G11C 8/18* (2013.01)

(58) Field of Classification Search
CPC .......... G11C 7/00; G11C 7/1066; G11C 7/222
See application file for complete search history.

(56) References Cited

U.S. PATENT DOCUMENTS

| | | | |
|---|---|---|---|
| 2006/0044891 A1* | 3/2006 | Lin | G11C 7/1087 365/193 |
| 2014/0229668 A1 | 8/2014 | Oda | |
| 2019/0279692 A1* | 9/2019 | Song | G11C 7/1066 |

FOREIGN PATENT DOCUMENTS

KR 20050101864 A 10/2015

* cited by examiner

*Primary Examiner* — Han Yang

(57) ABSTRACT

A semiconductor device includes a control circuit configured to receive a clock and generate first to fourth internal clocks which have different phases, and generate first to fourth masking clocks from a latency signal in synchronization with the first internal clock and the second internal clock depending on a mode signal; and a signal mixing circuit configured to output the first to fourth internal clocks as first to fourth strobe signals during enable periods of the first to fourth masking clocks.

20 Claims, 13 Drawing Sheets

SEMICONDUCTOR DEVICE

CROSS-REFERENCE TO RELATED APPLICATION

The present application claims priority under 35 U.S.C. § 119(a) to Korean Patent Application No. 10-2019-0002384 filed on Jan. 8, 2019 in the Korean Intellectual Property Office, which is incorporated herein by reference in its entirety.

BACKGROUND

1. Technical Field

Embodiments of the disclosure may generally relate to a semiconductor device which inputs and outputs data in synchronization with a strobe signal.

2. Related Art

In a synchronous semiconductor device, a command, an address and data are inputted in synchronization with a clock. In a DDR (double data rate) synchronous semiconductor device, a command, an address and data are inputted in synchronization with both the rising edge and the falling edge of a clock. In an SDR (single data rate) synchronous semiconductor device, a command, an address and data are inputted in synchronization with the rising edge of a clock.

SUMMARY

Various embodiments may be directed to a semiconductor device which generates a strobe signal from an internal clock during the enable period of a masking clock and outputs the strobe signal through a plurality of repeaters to a pad.

In an embodiment, a semiconductor device may include: a control circuit configured to receive a clock and generate a first to fourth internal clocks, and to generate a first to fourth masking clocks from a latency signal in synchronization with the first internal clock and the second internal clock in accordance with a mode signal; and a signal mixing circuit configured to output the first to fourth internal clocks as first to fourth strobe signals during respective enable periods of the first to fourth masking clocks, wherein each of the first to fourth internal clocks have a different phase.

In an embodiment, a semiconductor device may include: a signal mixing circuit configured to output first to fourth internal clocks which have different phases, as first to fourth strobe signals, during enable periods of first to fourth masking clocks; and a signal transfer circuit configured to transmit the first to fourth strobe signals to a first pad and a second pad, wherein the first to fourth strobe signals to be transmitted to the first pad are amplified by a first amplification amount, and the first to fourth strobe signals to be transmitted to the second pad are amplified by a second amplification amount.

According to the embodiments disclosed herein, a strobe signal may be generated from an internal clock during the enable period of a masking clock, and the strobe signal may be outputted through a plurality of repeaters to a pad. As a consequence, it may be possible to generate a stable strobe signal even with a change in process, voltage or temperature (PVT).

DETAILED DESCRIPTION

Hereinafter, a semiconductor device will be described below with reference to the accompanying drawings and through various examples of embodiments.

Figure 1:
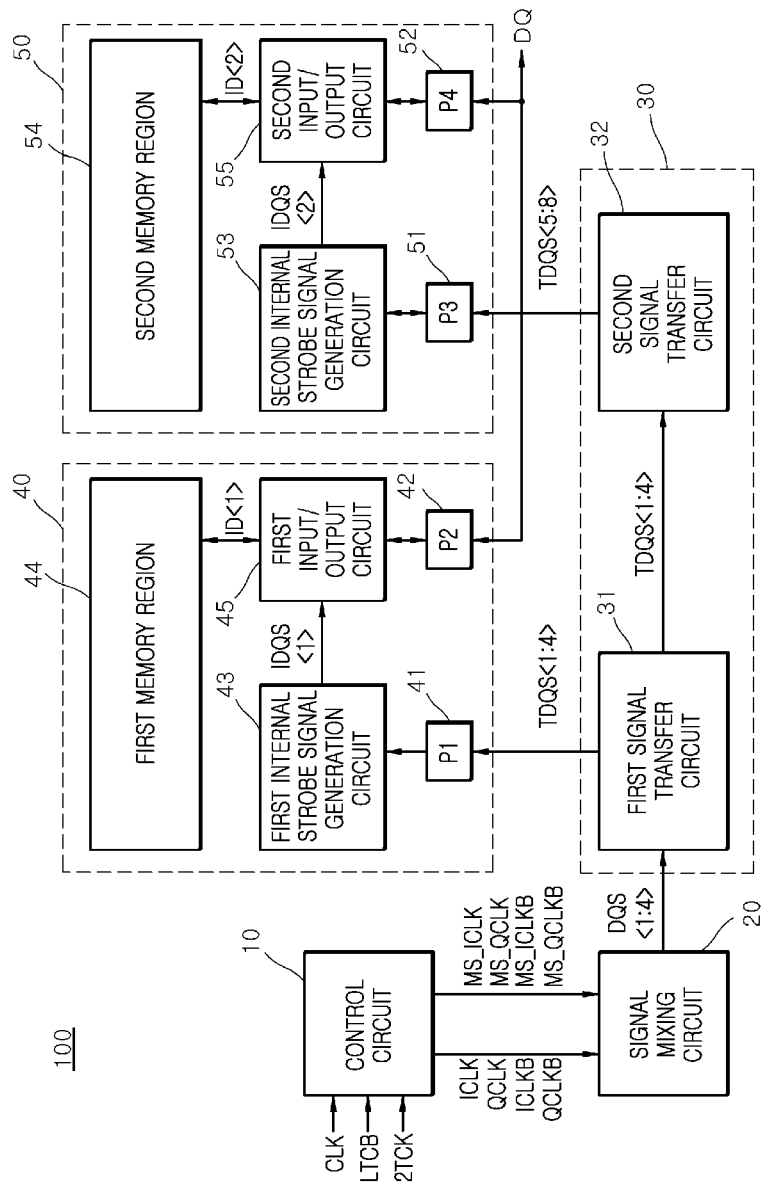
FIG. 1 is a block diagram illustrating a representation of an example of a configuration of a semiconductor device in accordance with an embodiment.

Referring to FIG. 1, a semiconductor device 100 in accordance with an embodiment may include a control circuit 10, a signal mixing circuit 20, a signal transfer circuit 30, a first bank 40 and a second bank 50.

The control circuit 10 may receive a clock CLK and generate a first internal clock ICLK, a second internal clock QCLK, a third internal clock ICLKB and a fourth internal clock QCLKB, each of which has a different frequency. The control circuit 10 may generate a first masking clock MS_ICLK; a second masking clock MS_QCLK; a third masking clock MS_ICLKB; and a fourth masking clock MS_QCLKB from a latency signal LTCB in synchronization with the first internal clock ICLK and the second internal clock QCLK, and according to a mode signal 2TCK. The first internal clock ICLK, the second internal clock QCLK, the third internal clock ICLKB and the fourth internal clock QCLKB may each have a different phase. The mode signal 2TCK is a signal used in connection with setting first and second preamble periods of first and second internal strobe signals IDQS<1:2>, as described in more detail below. The first preamble period may be set to one cycle of the clock CLK, and the second preamble period may be set to two cycles of the clock CLK. According to other embodiments, the first and second preamble periods may be set to various cycles or number of cycles of the clock CLK. The latency signal LTCB may include a pulse that is generated in a write operation and a read operation. The internal configuration of the control circuit 10 will be described later with reference to FIG. 2.

The signal mixing circuit 20 may output the first internal clock ICLK as a first strobe signal DQS<1> during the enable period of the first masking clock MS_ICLK. The signal mixing circuit 20 may output the second internal clock QCLK as a second strobe signal DQS<2> during the enable period of the second masking clock MS_QCLK. The signal mixing circuit 20 may output the third internal clock ICLKB as a third strobe signal DQS<3> during the enable period of the third masking clock MS_ICLKB. The signal mixing circuit 20 may output the fourth internal clock QCLKB as a fourth strobe signal DQS<4> during the enable period of the fourth masking clock MS_QCLKB. The internal configuration of the signal mixing circuit 20 will be described later with reference to FIG. 8.

The signal transfer circuit 30 may include a first signal transfer circuit 31 and a second signal transfer circuit 32.

The first signal transfer circuit 31 may be realized to include at least one repeater. The first signal transfer circuit 31 may generate first to fourth transfer strobe signals TDQS<1:4> by amplifying the first to fourth strobe signals DQS<1:4> through at least one repeater. The first signal transfer circuit 31 may generate the first to fourth transfer strobe signals TDQS<1:4> by amplifying the first to fourth strobe signals DQS<1:4> by a first amplification amount. The first signal transfer circuit 31 may transmit the first to fourth transfer strobe signals TDQS<1:4> to a first pad 41. The number of repeaters included in the first signal transfer circuit 31 may be predetermined, or may vary depending on the length of a path through which the first to fourth strobe signals DQS<1:4> are transmitted. For example, the number of repeaters included in the first signal transfer circuit 31 may increase as the length of a path through which the first to fourth strobe signals DQS<1:4> are transferred is lengthened or increased. The internal configuration of the first signal transfer circuit 31 will be described later with reference to FIG. 9.

The second signal transfer circuit 32 may be realized to include at least one repeater. The second signal transfer circuit 32 may generate fifth to eighth transfer strobe signals TDQS<5:8> by amplifying the first to fourth transfer strobe signals TDQS<1:4> through at least one repeater. The second signal transfer circuit 32 may generate the fifth to eighth transfer strobe signals TDQS<5:8> by amplifying the first to fourth strobe signals DQS<1:4> by a second amplification amount. The second signal transfer circuit 32 may transmit the fifth to eighth transfer strobe signals TDQS<5:8> to a third pad 51. The number of repeaters included in the second signal transfer circuit 32 may be preset, or may vary depending on the length of a path through which the first to fourth transfer strobe signals TDQS<1:4> are transmitted. For example, the number of repeaters included in the second signal transfer circuit 32 may increase as the length of a path through which the first to fourth transfer strobe signals TDQS<1:4> are transferred is lengthened or increased.

In an example, the second amplification amount may be set to be larger than the first amplification amount. A transmission length through which the first to fourth strobe signals DQS<1:4> are transmitted, as the first to fourth transfer strobe signals TDQS<1:4> through the first pad 41, may be set as a first transmission length. A transmission length through which the first to fourth strobe signals DQS<1:4> are transmitted, as the fifth to eighth transfer strobe signals TDQS<5:8> through the third pad 51, may be set as a second transmission length. The second transmission length may be set to be longer than the first transmission length.

The signal transfer circuit 30, in accordance with embodiments disclosed herein, may include at least one repeater, and may amplify the first to fourth strobe signals DQS<1:4> through at least one repeater, and may transmit resultant signals to the first pad 41 and the third pad 51.

The first bank 40 may include the first pad 41, a second pad 42, a first internal strobe signal generation circuit 43, a first memory region 44 and a first input/output circuit 45.

The first internal strobe signal generation circuit 43 may generate a first internal strobe signal IDQS<1> by mixing the first to fourth transfer strobe signals TDQS<1:4> received from the first pad 41. An operation of generating the first internal strobe signal IDQS<1> by mixing the first to fourth transfer strobe signals TDQS<1:4> will be explained through a configuration which will be described later.

The first memory region 44 may store a first internal data ID<1> in a write operation, and may output the stored first internal data ID<1> in a read operation. The first memory region 44 may be realized by a volatile memory device or a nonvolatile memory device, which may include a plurality of memory cell arrays.

The first input/output circuit 45 may input/output the first internal data ID<1> from/through the second pad 42 in synchronization with the first internal strobe signal IDQS<1>. The first input/output circuit 45 may output data DQ, inputted through the second pad 42 in a write operation, as the first internal data ID<1> in synchronization with the first internal strobe signal IDQS<1>. In a read operation, the first input/output circuit 45 may output the first internal data ID<1> as data DQ through the second pad 42 in synchronization with the first internal strobe signal IDQS<1>.

The first bank 40, in accordance with the embodiment and configured as disclosed above, may store the data DQ, as the first internal data ID<1> inputted through the second pad 42, in synchronization with the first to fourth transfer strobe signals TDQS<1:4> transmitted to the first pad 41, in the write operation. The first bank 40 may output the first internal data ID<1> through the second pad 42, as the data DQ, in synchronization with the first to fourth transfer strobe signals TDQS<1:4> transmitted to the first pad 41, in the read operation.

The second bank 50 may include the third pad 51, a fourth pad 52, a second internal strobe signal generation circuit 53, a second memory region 54 and a second input/output circuit 55.

The second internal strobe signal generation circuit 53 may generate a second internal strobe signal IDQS<2> by mixing the fifth to eighth transfer strobe signals TDQS<5:8> received from the third pad 51. An operation of generating the second internal strobe signal IDQS<2> by mixing the fifth to eighth transfer strobe signals TDQS<5:8> may be the same or substantially the same as the operation of generating the first internal strobe signal IDQS<1>, and thus, will also be explained through a configuration which will be described later.

The second memory region 54 may store a second internal data ID<2> in a write operation, and may output the stored second internal data ID<2> in a read operation. The second memory region 54 may be realized by a volatile memory device or a nonvolatile memory device, which may include a plurality of memory cell arrays.

The second input/output circuit 55 may input/output the second internal data ID<2> from/through the fourth pad 52 in synchronization with the second internal strobe signal IDQS<2>. The second input/output circuit 55 may output data DQ, inputted through the fourth pad 52 in a write operation, as the second internal data ID<2> in synchronization with the second internal strobe signal IDQS<2>. In a read operation, the second input/output circuit 55 may output the second internal data ID<2> as data DQ through the fourth pad 52 in synchronization with the second internal strobe signal IDQS<2>.

The second bank 50 in accordance with the embodiment, configured as described above, may store the data DQ, as the second internal data ID<2> inputted through the fourth pad 52, in synchronization with the fifth to eighth transfer strobe signals TDQS<5:8> transmitted to the third pad 51, in the write operation. The second bank 50 may output the second internal data ID<2> through the fourth pad 52, as the data DQ, in synchronization with the fifth to eighth transfer strobe signals TDQS<5:8> transmitted to the third pad 51, in the read operation.

Figure 2:
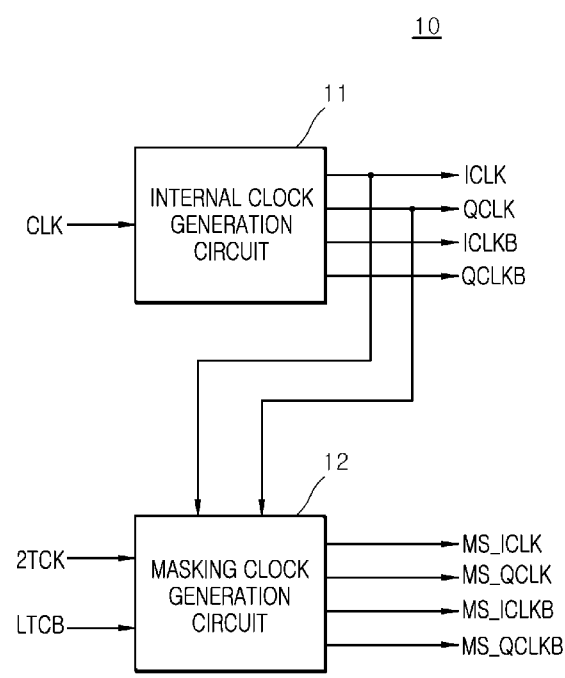
FIG. 2 is a block diagram illustrating a representation of an example of an internal configuration of a control circuit included in the semiconductor device illustrated in FIG. 1.

Referring to FIG. 2, the control circuit 10 may include an internal clock generation circuit 11 and a masking clock generation circuit 12.

The internal clock generation circuit 11 may receive the clock CLK and generate the first internal clock ICLK, the second internal clock QCLK, the third internal clock ICLKB and the fourth internal clock QCLKB, each of which has a different phase. The internal clock generation circuit 11 may generate the first internal clock ICLK in synchronization with the rising edge of the clock CLK. The internal clock generation circuit 11 may generate the second internal clock QCLK with a phase difference of 90 degrees from that of the first internal clock ICLK. The internal clock generation circuit 11 may generate the third internal clock ICLKB with a phase difference of 90 degrees from that of the second internal clock QCLK. The internal clock generation circuit 11 may generate the fourth internal clock QCLKB with a phase difference of 90 degrees from that of the third internal clock ICLKB. The internal clock generation circuit 11 may be realized by a PLL (phase-locked loop) circuit or a DLL (delay-locked loop) circuit.

The masking clock generation circuit 12 may generate the first masking clock MS_ICLK, the second masking clock MS_QCLK, the third masking clock MS_ICLKB and the fourth masking clock MS_QCLKB from the latency signal LTCB in synchronization with the first internal clock ICLK and the second internal clock QCLK, depending on the mode signal 2TCK. The masking clock generation circuit 12 may generate the first masking clock MS_ICLK, the second masking clock MS_QCLK, the third masking clock MS_ICLKB and the fourth masking clock MS_QCLKB, for setting the first preamble period, from the latency signal LTCB when the mode signal 2TCK is disabled. The masking clock generation circuit 12 may generate the first masking clock MS_ICLK, the second masking clock MS_QCLK, the third masking clock MS_ICLKB and the fourth masking clock MS_QCLKB, for setting the second preamble period, from the latency signal LTCB when the mode signal 2TCK is enabled. The internal configuration of the masking clock generation circuit 12 will be described below and with reference to FIG. 3.

Figure 3:
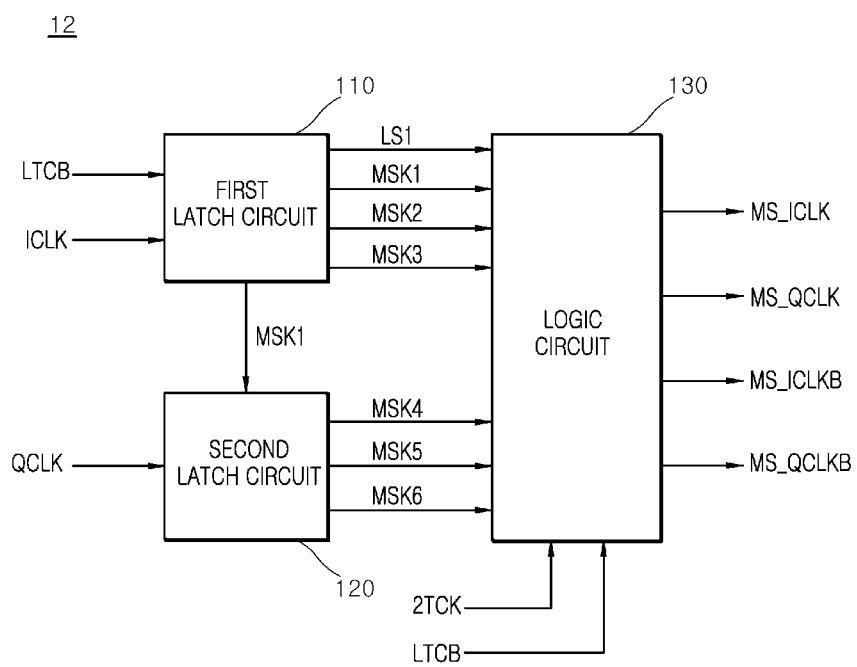
FIG. 3 is a block diagram illustrating a representation of an example of an internal configuration of a masking clock generation circuit included in the control circuit illustrated in FIG. 2.

Referring to FIG. 3, the masking clock generation circuit 12 may include a first latch circuit 110, a second latch circuit 120 and a logic circuit 130.

The first latch circuit 110 may latch the latency signal LTCB in synchronization with the first internal clock ICLK. The first latch circuit 110 may shift the latched latency signal LTCB and generate a first latch signal LS1, a first masking signal MSK1, a second masking signal MSK2 and a third masking signal MSK3. The internal configuration of the first latch circuit 110 will be described later with reference to FIG. 4.

The second latch circuit 120 may latch the first masking signal MSK1 in synchronization with the second internal clock QCLK. The second latch circuit 120 may shift the latched first masking signal MSK1 and generate a fourth masking signal MSK4, a fifth masking signal MSK5 and a sixth masking signal MSK6. The internal configuration of the second latch circuit 120 will be described later with reference to FIG. 5.

The logic circuit 130 may generate the first masking clock MS_ICLK, the second masking clock MS_QCLK, the third masking clock MS_ICLKB and the fourth masking clock MS_QCLKB from the first latch signal LS1, the first masking signal MSK1, the second masking signal MSK2, the third masking signal MSK3, the fourth masking signal MSK4, the fifth masking signal MSK5 and the sixth masking signal MSK6, depending on the logic levels of the mode signal 2TCK and the latency signal LTCB. The internal configuration of the logic circuit 130 will be described later with reference to FIG. 6.

Figure 4:
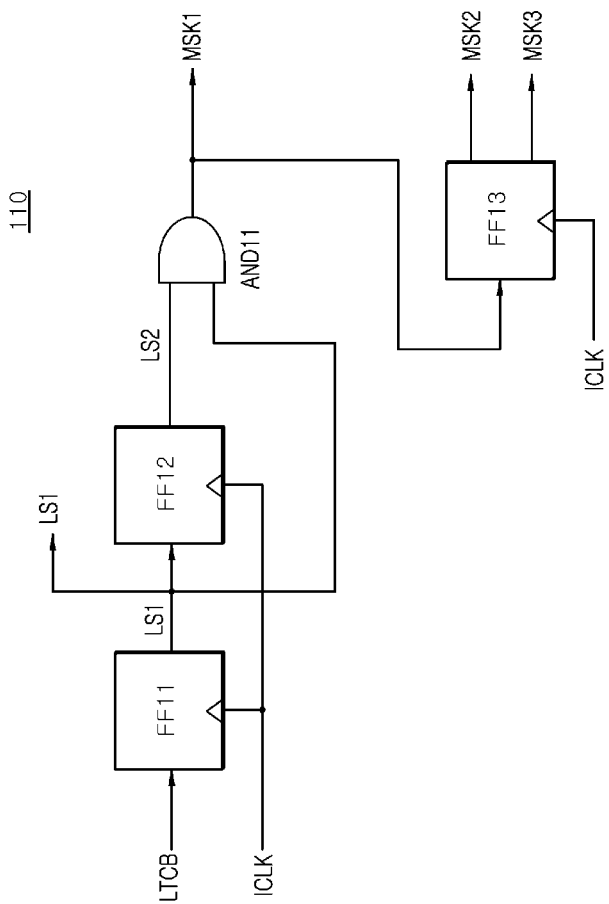
FIG. 4 is a diagram illustrating a representation of an example of an internal configuration of a first latch circuit included in the masking clock generation circuit illustrated in FIG. 3.

Referring to FIG. 4, the first latch circuit 110 may be realized by flip-flops FF11, FF12 and FF13 and an AND gate AND11.

The flip-flop FF11 may latch the latency signal LTCB in synchronization with the rising edge of the first internal clock ICLK and generate the first latch signal LS1.

The flip-flop FF12 may latch the first latch signal LS1 in synchronization with the rising edge of the first internal clock ICLK and generate a second latch signal LS2.

The AND gate AND11 may mix the first latch signal LS1 and the second latch signal LS2 and generate the first masking signal MSK1. The AND gate AND11 may generate the first masking signal MSK1 by performing an AND logic function on the first latch signal LS1 and the second latch signal LS2.

The flip-flop FF13 may latch the first masking signal MSK1 in synchronization with the falling edge of the first internal clock ICLK and generate the second masking signal MSK2. The flip-flop FF13 may latch the first masking signal MSK1 in synchronization with the rising edge of the first internal clock ICLK and generate the third masking signal MSK3.

Figure 5:
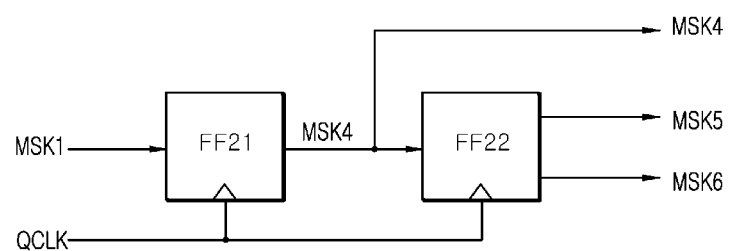
FIG. 5 is a diagram illustrating a representation of an example of an internal configuration of a second latch circuit included in the masking clock generation circuit illustrated in FIG. 3.

Referring to FIG. 5, the second latch circuit 120 may be realized by flip-flops FF21 and FF22.

The flip-flop FF21 may latch the first masking signal MSK1 in synchronization with the rising edge of the second internal clock QCLK and generate the fourth masking signal MSK4.

The flip-flop FF22 may latch the fourth masking signal MSK4 in synchronization with the falling edge of the second internal clock QCLK and generate the fifth masking signal MSK5. The flip-flop FF22 may latch the fourth masking signal MSK4 in synchronization with the rising edge of the second internal clock QCLK and generate the sixth masking signal MSK6.

Figure 6:
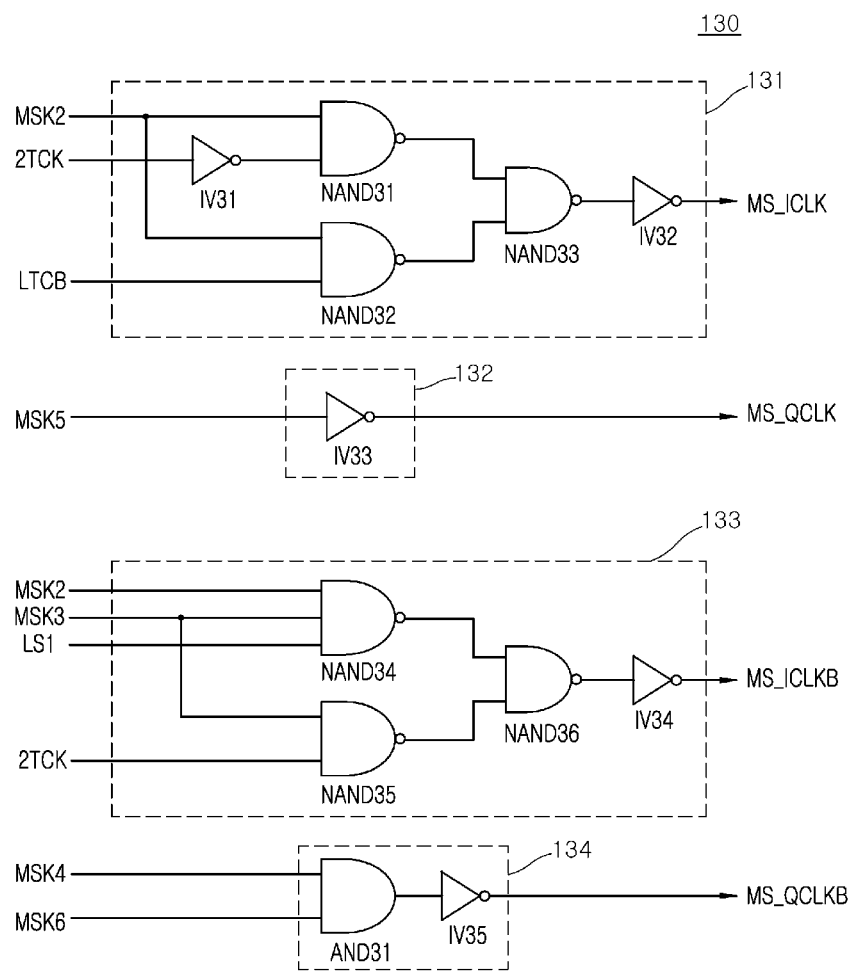
FIG. 6 is a circuit diagram illustrating a representation of an example of an internal configuration of a logic circuit included in the masking clock generation circuit illustrated in FIG. 3.

Referring to FIG. 6, the logic circuit 130 may include a first logic circuit 131, a second logic circuit 132, a third logic circuit 133 and a fourth logic circuit 134.

The first logic circuit 131 may be realized by inverters IV31 and IV32 and NAND gates NAND31, NAND32 and NAND33. The first logic circuit 131 may generate the first masking clock MS_ICLK by inverting and buffering the second masking signal MSK2 in the case where the mode signal 2TCK is disabled to a logic low level. The first logic circuit 131 may generate the first masking clock MS_ICLK by mixing the latency signal LTCB and the second masking signal MSK2 in the case where the mode signal 2TCK is enabled to a logic high level.

The second logic circuit 132 may be realized by an inverter IV33. The second logic circuit 132 may generate the second masking clock MS_QCLK by inverting and buffering the fifth masking signal MSK5.

The third logic circuit 133 may be realized by NAND gates NAND34, NAND35 and NAND36 and an inverter IV34. The third logic circuit 133 may generate the third masking clock MS_ICLKB by mixing the first latch signal LS1, the second masking signal MSK2 and the third masking signal MSK3 in the case where the mode signal 2TCK is disabled to the logic low level. The third logic circuit 133 may generate the third masking clock MS_ICLKB by inverting and buffering the third masking signal MSK3 in the case where the mode signal 2TCK is enabled to the logic high level.

The fourth logic circuit 134 may be realized by an AND gate AND31 and an inverter IV35. The fourth logic circuit 134 may generate the fourth masking clock MS_QCLKB by mixing the fourth masking signal MSK4 and the sixth masking signal MSK6.

Figure 7:
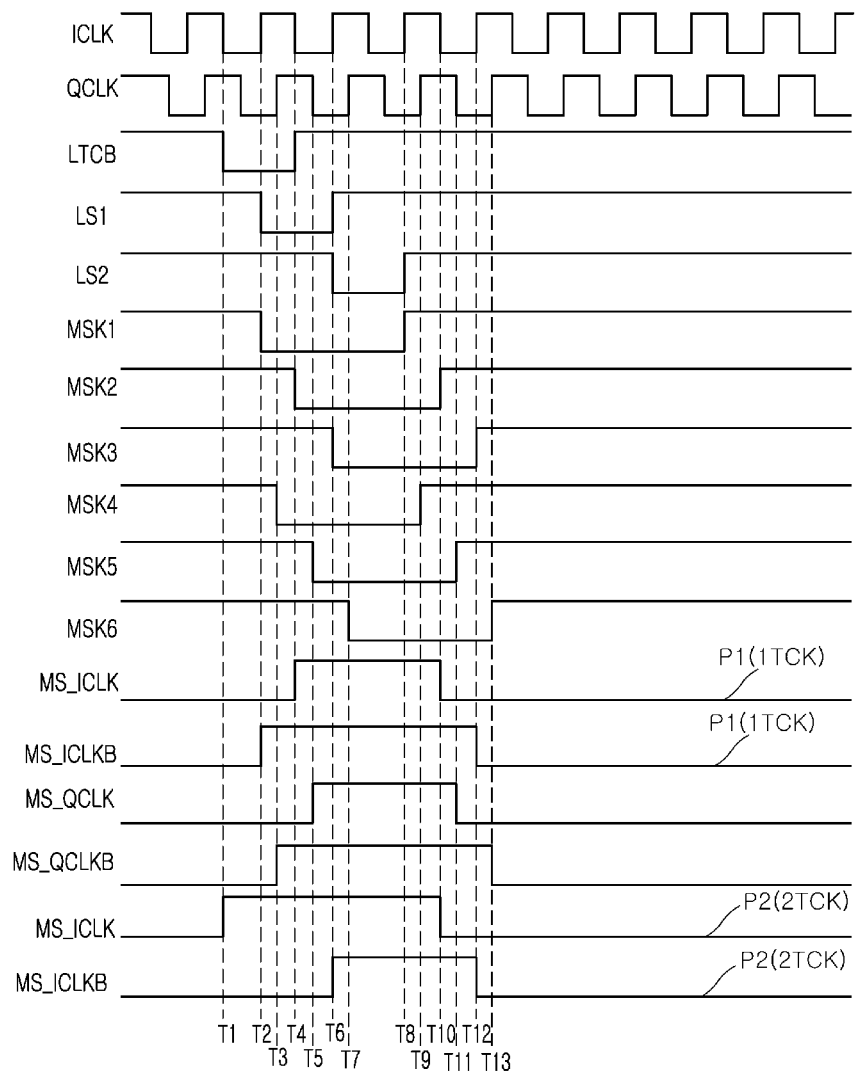
FIG. 7 is a representation of an example of a timing diagram to assist in the explanation of an operation of generating masking clocks in a semiconductor device in accordance with an embodiment.

Examples of operations generating the first to fourth masking clocks MS_ICLK, MS_QCLK, MS_ICLKB and MS_QCLKB in the semiconductor device 100 in accordance with embodiments disclosed herein will be described below with reference to FIG. 7. Operations may be divided into operations generating the first to fourth masking clocks MS_ICLK, MS_QCLK, MS_ICLKB and MS_QCLKB for setting the first preamble period and the second preamble period.

In this example, it is assumed that the phase difference of the first internal clock ICLK and the second internal clock QCLK is set to 90 degrees, however other embodiments contemplated by the disclosure may use different phases.

First, an operation of generating the first to fourth masking clocks MS_ICLK, MS_QCLK, MS_ICLKB and MS_QCLKB for setting a first preamble period P1(1TCK) will be described below.

In a write operation and a read operation, the latency signal LTCB including a pulse of a logic low level is inputted from a time T1 to a time T4. The mode signal 2TCK for setting the first preamble period P1(1TCK) is inputted by being disabled to the logic low level.

At a time T2, the first latch circuit 110 latches the latency signal LTCB, with the pulse of a low logic level from a time T1 to a time T4, in synchronization with the rising edge of the first internal clock ICLK. The first latch circuit 110 generates the first latch signal LS1 of a logic low level and the first masking signal MSK1 of a logic low level.

The third logic circuit 133 of the logic circuit 130 generates the third masking clock MS_ICLKB of a logic high level by mixing the first latch signal LS1, the second masking signal MSK2 and the third masking signal MSK3, since the mode signal 2TCK is disabled to the logic low level.

At a time T3, the second latch circuit 120 latches the first masking signal MSK1 in synchronization with the rising edge of the second internal clock QCLK, and generates the fourth masking signal MSK4 of a logic low level.

The fourth logic circuit 134 of the logic circuit 130 generates the fourth masking clock MS_QCLKB of a logic high level by mixing the fourth masking signal MSK4 and the sixth masking signal MSK6.

At the time T4, the first latch circuit 110 latches the first masking signal MSK1 in synchronization with the falling edge of the first internal clock ICLK, and generates the second masking signal MSK2 of a logic low level.

The first logic circuit 131 of the logic circuit 130 generates the first masking clock MS_ICLK of a logic high level by inverting and buffering the second masking signal MSK2 by the mode signal 2TCK of the logic low level.

At a time T5, the second latch circuit 120 latches the fourth masking signal MSK4 in synchronization with the falling edge of the second internal clock QCLK, and generates the fifth masking signal MSK5 of a logic low level.

The second logic circuit 132 generates the second masking clock MS_QCLK of a logic high level by inverting and buffering the fifth masking signal MSK5.

At a time T6, the first latch circuit 110 latches the first latch signal LS1 of the time T2 in synchronization with the rising edge of the first internal clock ICLK, and generates the second latch signal LS2 and the first masking signal MSK1 of logic low levels. The first latch circuit 110 latches the first masking signal MSK1 in synchronization with the rising edge of the first internal clock ICLK, and generates the third masking signal MSK3 of a logic low level.

At a time T7, the second latch circuit 120 latches the fourth masking signal MSK4 in synchronization with the rising edge of the second internal clock QCLK, and generates the sixth masking signal MSK6 of a logic low level.

At a time T8, the first latch circuit 110 mixes the first latch signal LS1 and the second latch signal LS2 of logic high levels in synchronization with the rising edge of the first internal clock ICLK, and generates the first masking signal MSK1 of a logic high level.

At a time T9, the second latch circuit 120 latches the first masking signal MSK1 in synchronization with the rising edge of the second internal clock QCLK, and generates the fourth masking signal MSK4 of a logic high level.

At a time T10, the first latch circuit 110 latches the first masking signal MSK1 in synchronization with the falling edge of the first internal clock ICLK, and generates the second masking signal MSK2 of a logic high level.

The first logic circuit 131 of the logic circuit 130 generates the first masking clock MS_ICLK of a logic low level by inverting and buffering the second masking signal MSK2 by the mode signal 2TCK of the logic low level. That is to say, the first masking clock MS_ICLK is enabled to the logic high level from the time T4 to the time T10.

At a time T11, the second latch circuit 120 latches the fourth masking signal MSK4 in synchronization with the falling edge of the second internal clock QCLK, and generates the fifth masking signal MSK5 of a logic high level.

The second logic circuit 132 generates the second masking clock MS_QCLK of a logic low level by inverting and buffering the fifth masking signal MSK5. That is to say, the second masking clock MS_QCLK is enabled to the logic high level from the time T5 to the time T11.

At a time T12, the first latch circuit 110 latches the first masking signal MSK1 in synchronization with the rising edge of the first internal clock ICLK, and generates the third masking signal MSK3 of a logic high level.

The third logic circuit 133 of the logic circuit 130 generates the third masking clock MS_ICLKB of a logic low level by mixing the first latch signal LS1, the second masking signal MSK2 and the third masking signal MSK3 because the mode signal 2TCK is disabled to the logic low level. Put another way, the third masking clock MS_ICLKB is enabled to the logic high level from the time T2 to the time T12.

At a time T13, the second latch circuit 120 latches the fourth masking signal MSK4 in synchronization with the rising edge of the second internal clock QCLK, and generates the sixth masking signal MSK6 of a logic high level.

The fourth logic circuit 134 of the logic circuit 130 generates the fourth masking clock MS_QCLKB of a logic low level by mixing the fourth masking signal MSK4 and the sixth masking signal MSK6. That is to say, the fourth masking clock MS_QCLKB is enabled to the logic high level from the time T3 to the time T13.

Second, examples of operations generating the first to fourth masking clocks MS_ICLK, MS_QCLK, MS_ICLKB and MS_QCLKB for setting a second preamble period P2(2TCK) will be described below. In this regard, since the second masking clock MS_QCLK and the fourth masking clock MS_QCLKB have the same or substantially similar logic levels as in the operations generating second masking clock MS_QCLK and the fourth masking clock MS_QCLKB for setting the first preamble period P1(1TCK), detailed descriptions will be omitted herein.

At the time T1, the first logic circuit 131 of the logic circuit 130 generates the first masking clock MS_ICLK of the logic high level by mixing the latency signal LTCB and the second masking signal MSK2, because the mode signal 2TCK for setting the second preamble period P2(2TCK) is enabled to the logic high level.

At the time T6, the third logic circuit 133 of the logic circuit 130 generates the third masking clock MS_ICLKB of the logic high level by inverting and buffering the third masking signal MSK3 in accordance with the mode signal 2TCK enabled to the logic high level.

At the time T10, the first logic circuit 131 generates the first masking clock MS_ICLK of the logic low level by mixing the latency signal LTCB and the second masking signal MSK2, with the mode signal 2TCK enabled to the logic high level. That is to say, the first masking clock MS_ICLK is enabled to the logic high level from the time T1 to the time T10.

At the time T12, the third logic circuit 133 generates the third masking clock MS_ICLKB of the logic low level by inverting and buffering the third masking signal MSK3, as the mode signal 2TCK is enabled to the logic high level. That is to say, the third masking clock MS_ICLKB is enabled to the logic high level from the time T6 to the time T12.

Figure 8:
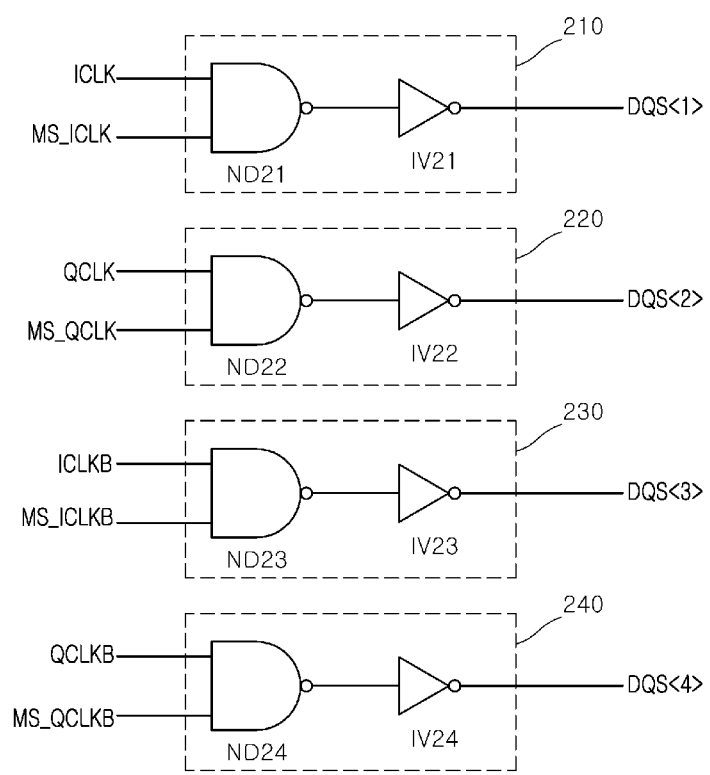
FIG. 8 is a circuit diagram illustrating a representation of an example of an internal configuration of a signal mixing circuit included in the semiconductor device illustrated in FIG. 1.

Referring to FIG. 8, the signal mixing circuit 20 in accordance with an embodiment may include a first mixing circuit 210, a second mixing circuit 220, a third mixing circuit 230 and a fourth mixing circuit 240.

The first mixing circuit 210 may be realized by a NAND gate ND21 and an inverter IV21. The first mixing circuit 210 may generate the first strobe signal DQS<1> by buffering the first internal clock ICLK during a period in which the first masking clock MS_ICLK is enabled to the logic high level. The first mixing circuit 210 may generate the first strobe signal DQS<1> by performing an AND logic function on the first masking clock MS_ICLK and the first internal clock ICLK.

The second mixing circuit 220 may be realized by a NAND gate ND22 and an inverter IV22. The second mixing circuit 220 may generate the second strobe signal DQS<2> by buffering the second internal clock QCLK during a period in which the second masking clock MS_QCLK is enabled to the logic high level. The second mixing circuit 220 may generate the second strobe signal DQS<2> by performing an AND logic function on the second masking clock MS_QCLK and the second internal clock QCLK.

The third mixing circuit 230 may be realized by a NAND gate ND23 and an inverter IV23. The third mixing circuit 230 may generate the third strobe signal DQS<3> by buffering the third internal clock ICLKB during a period in which the third masking clock MS_ICLKB is enabled to the logic high level. The third mixing circuit 230 may generate the third strobe signal DQS<3> by performing an AND logic function on the third masking clock MS_ICLKB and the third internal clock ICLKB.

The fourth mixing circuit 240 may be realized by a NAND gate ND24 and an inverter IV24. The fourth mixing circuit 240 may generate the fourth strobe signal DQS<4> by buffering the fourth internal clock QCLKB during a period in which the fourth masking clock MS_QCLKB is enabled to the logic high level. The fourth mixing circuit 240 may generate the fourth strobe signal DQS<4> by performing an AND logic function on the fourth masking clock MS_QCLKB and the fourth internal clock QCLKB.

Figure 9:
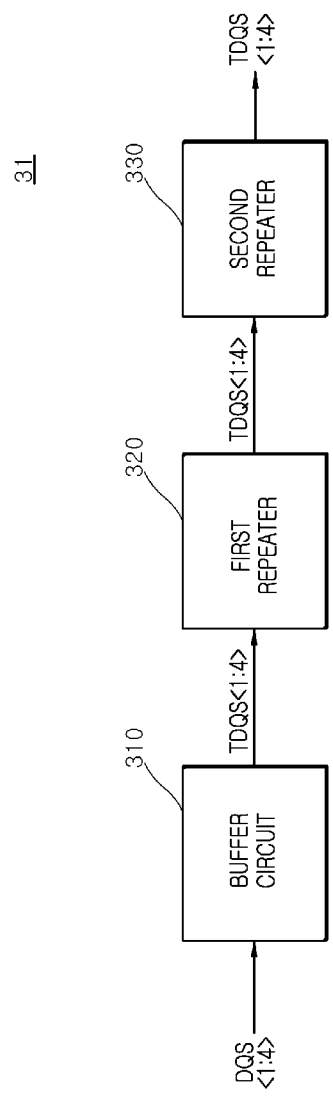
FIG. 9 is a block diagram illustrating a representation of an example of an internal configuration of a first signal transfer circuit included in the semiconductor device illustrated in FIG. 1.

Referring to FIG. 9, the first signal transfer circuit 31 may include a buffer circuit 310, a first repeater 320 and a second repeater 330.

The buffer circuit 310 may generate the first to fourth transfer strobe signals TDQS<1:4> by buffering the first to fourth strobe signals DQS<1:4>. The internal configuration of the buffer circuit 310 will be described later with reference to FIG. 10.

The first repeater 320 may amplify and output the first to fourth transfer strobe signals TDQS<1:4>. The first repeater 320 may be realized by an inverter and a driver which are generally known in the art, and may amplify and output the first to fourth transfer strobe signals TDQS<1:4>.

The second repeater 330 may amplify and output the first to fourth transfer strobe signals TDQS<1:4> which are outputted from the first repeater 320. The second repeater 330 may amplify the first to fourth transfer strobe signals TDQS<1:4> and transmit them to the first pad 41. The second repeater 330 may be realized by an inverter and a driver which are generally known in the art, and may amplify and output the first to fourth transfer strobe signals TDQS<1:4> received from the first repeater 320.

The first signal transfer circuit 31, in accordance with the embodiment described above, may generate the first to fourth transfer strobe signals TDQS<1:4> by amplifying the first to fourth strobe signals DQS<1:4> through the first repeater 320 and by amplifying again through the second repeater 330. The first signal transfer circuit 31 may output the first to fourth transfer strobe signals TDQS<1:4> from the second repeater 330 to the first pad 41.

Similarly, the second signal transfer circuit 32 illustrated in FIG. 1 may be realized by the same or substantially the same circuits as those used in the first signal transfer circuit 31. For example, in an embodiment, the second signal transfer circuit may also include a buffer circuit, a first repeater and a second repeater similar to those illustrated in FIG. 9, and may similarly generate the fifth to eighth transfer strobe signals TDQS<5:8> by amplifying the first to fourth transfer strobe signals TDQS<1:4>. The second signal transfer circuit 32 may transmit the amplified fifth to eighth transfer strobe signals TDQS<5:8> to the third pad 51.

Figure 10:
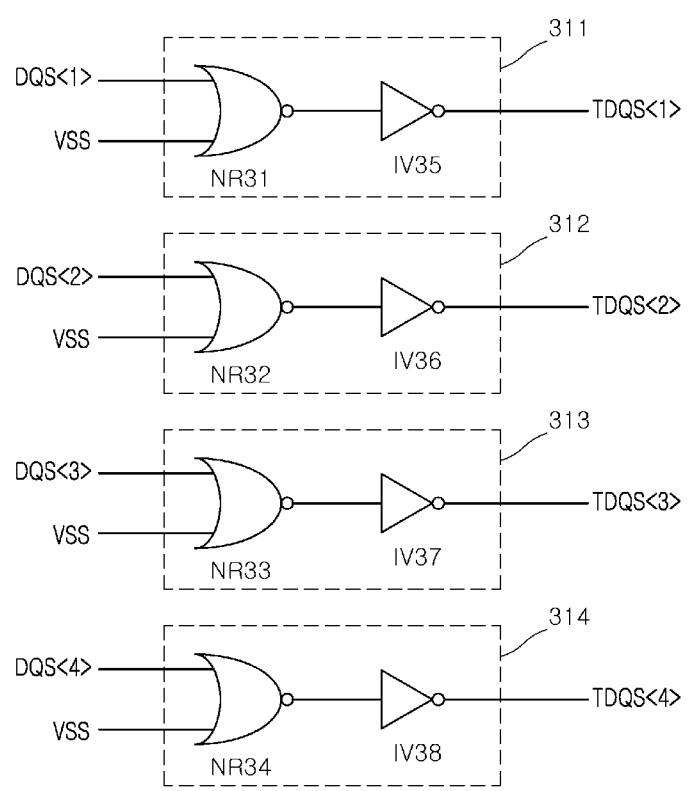
FIG. 10 is a circuit diagram illustrating a representation of an example of an internal configuration of a buffer circuit included in the first signal transfer circuit illustrated in FIG. 9.

Referring to FIG. 10, the buffer circuit 310 of the first signal transfer circuit 31 in accordance with an embodiment may include a first transfer circuit 311, a second transfer circuit 312, a third transfer circuit 313 and a fourth transfer circuit 314. The second signal transfer circuit 32 may have the same or substantially the same components and will therefore not be further illustrated to reduce repetition.

The first transfer circuit 311 may be realized by a NOR gate NR31 and an inverter IV35. The first transfer circuit 311 may generate the first transfer strobe signal TDQS<1> by buffering the first strobe signal DQS<1> depending on a ground voltage VSS. The first transfer circuit 311 may generate the first transfer strobe signal TDQS<1> by performing an OR logic function on the ground voltage VSS and the first strobe signal DQS<1>.

The second transfer circuit 312 may be realized by a NOR gate NR32 and an inverter IV36. The second transfer circuit 312 may generate the second transfer strobe signal TDQS<2> by buffering the second strobe signal DQS<2> depending on the ground voltage VSS. The second transfer circuit 312 may generate the second transfer strobe signal TDQS<2> by performing an OR logic function on the ground voltage VSS and the second strobe signal DQS<2>.

The third transfer circuit 313 may be realized by a NOR gate NR33 and an inverter IV37. The third transfer circuit 313 may generate the third transfer strobe signal TDQS<3> by buffering the third strobe signal DQS<3> depending on the ground voltage VSS. The third transfer circuit 313 may generate the third transfer strobe signal TDQS<3> by performing an OR logic function on the ground voltage VSS and the third strobe signal DQS<3>.

The fourth transfer circuit 314 may be realized by a NOR gate NR34 and an inverter IV38. The fourth transfer circuit 314 may generate the fourth transfer strobe signal TDQS<4> by buffering the fourth strobe signal DQS<4> depending on the ground voltage VSS. The fourth transfer circuit 314 may generate the fourth transfer strobe signal TDQS<4> by performing an OR logic function on the ground voltage VSS and the fourth strobe signal DQS<4>.

The buffer circuit 310 in accordance with the embodiment, configured as mentioned above, may generate the first to fourth transfer strobe signals TDQS<1:4> by buffering the first to fourth strobe signals DQS<1:4>.

Figure 11:
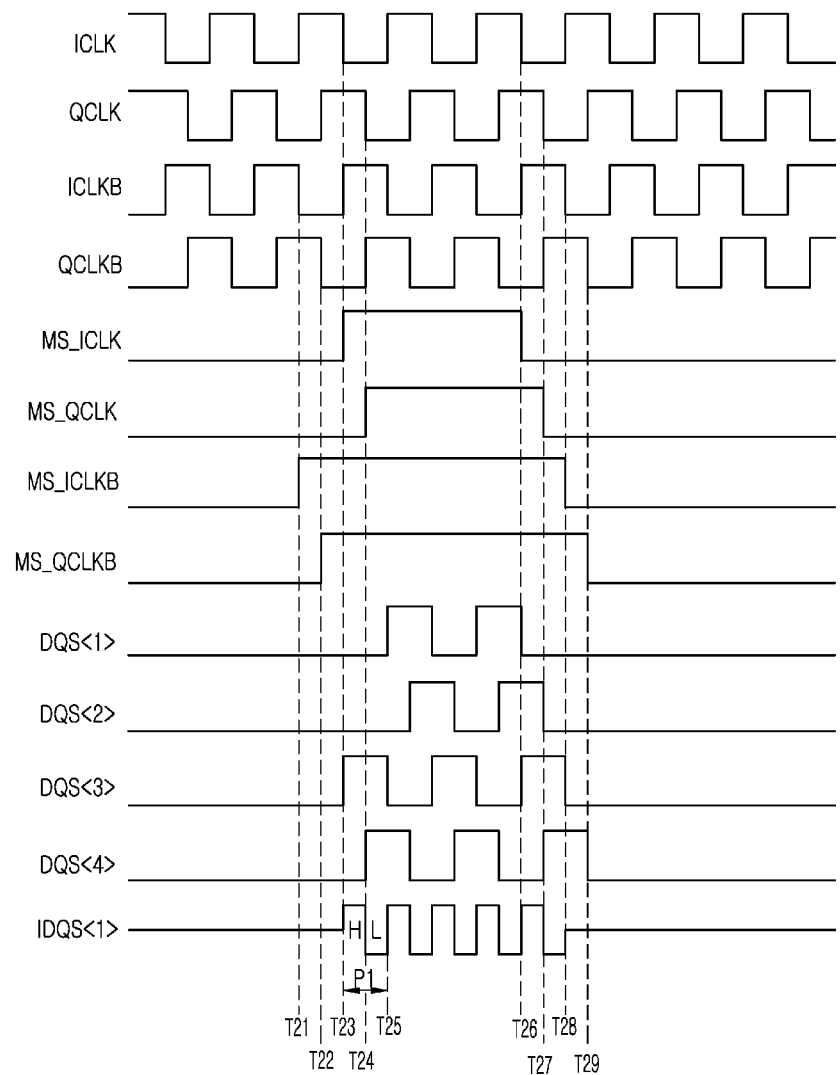
FIGS. 11 and 12 are representations of examples of timing diagrams to assist in the explanation of operations of a semiconductor device in accordance with an embodiment.

An example of an operation generating the first internal strobe signal IDQS<1> including the first preamble period, using the first to fourth internal clocks ICLK, QCLK, ICLKB and QCLKB and the first to fourth masking clocks MS_ICLK, MS_QCLK, MS_ICLKB and MS_QCLKB, in the semiconductor device 100 in accordance with an embodiment will be described below with reference to FIG. 11.

The first masking clock MS_ICLK is enabled to the logic high level from a time T23 to a time T26. The period from the time T23 to the time T26, in which the first masking clock MS_ICLK is enabled, is set to be the same as the period from the time T4 to the time T10 described above and with reference to FIG. 7.

The first mixing circuit 210 generates the first strobe signal DQS<1> which includes a first pulse and a second pulse, by buffering the first internal clock ICLK during the period from the time T23 to the time T26 in which the first masking clock MS_ICLK is enabled to the logic high level.

The second masking clock MS_QCLK is enabled to the logic high level from a time T24 to a time T27. The period from the time T24 to the time T27 in which the second masking clock MS_QCLK is enabled is set to be the same as the period from the time T5 to the time T11 described above with reference to FIG. 7.

The second mixing circuit 220 generates the second strobe signal DQS<2> which includes a first pulse and a second pulse, by buffering the second internal clock QCLK during the period from the time T24 to the time T27 in which the second masking clock MS_QCLK is enabled to the logic high level.

The third masking clock MS_ICLKB is enabled to the logic high level from a time T21 to a time T28. The period from the time T21 to the time T28 in which the third masking clock MS_ICLKB is enabled is set to be the same as the period from the time T2 to the time T12 described above with reference to FIG. 7.

The third mixing circuit 230 generates the third strobe signal DQS<3> which includes a first pulse, a second pulse and a third pulse, by buffering the third internal clock ICLKB during the period from the time T21 to the time T28 in which the third masking clock MS_ICLKB is enabled to the logic high level.

The fourth masking clock MS_QCLKB is enabled to the logic high level from a time T22 to a time T29. The period from the time T22 to the time T29 in which the fourth masking clock MS_QCLKB is enabled is set to be the same as the period from the time T3 to the time T13 described above with reference to FIG. 7.

The fourth mixing circuit 240 generates the fourth strobe signal DQS<4> which includes a first pulse, a second pulse and a third pulse, by buffering the fourth internal clock QCLKB during the period from the time T22 to the time T29 in which the fourth masking clock MS_QCLKB is enabled to the logic high level.

The first signal transfer circuit 31 generates the first to fourth transfer strobe signals TDQS<1:4> by amplifying the first to fourth strobe signals DQS<1:4> through at least one repeater.

The first internal strobe signal generation circuit 43 generates the first internal strobe signal IDQS<1>, which toggles from the time T23 to the time T28, by mixing the first to fourth transfer strobe signals TDQS<1:4>. A first preamble period P1 is set from the time T23 to a time T25. In the first preamble period P1, the first internal strobe signal IDQS<1> toggles to a logic high level H and a logic low level L. The first preamble period P1 is set to one cycle of the clock CLK.

Figure 12:
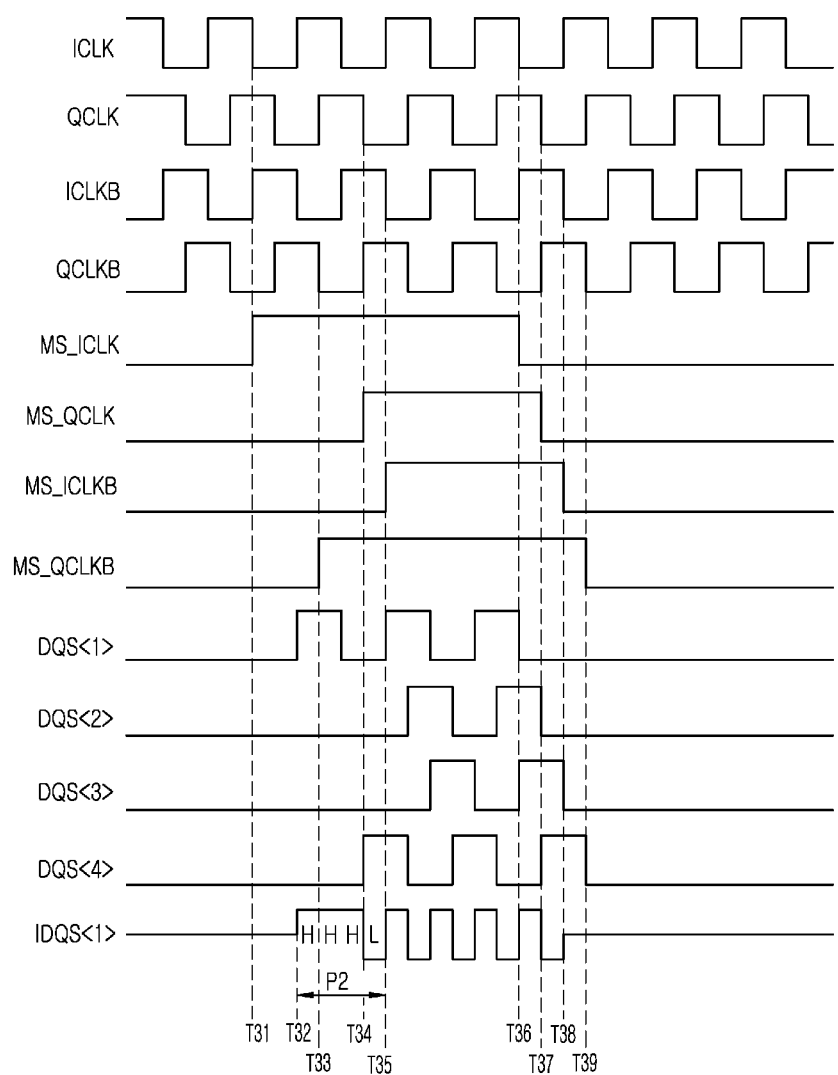

An example of an operation generating the first internal strobe signal IDQS<1> having the second preamble period, utilizing the first to fourth internal clocks ICLK, QCLK, ICLKB and QCLKB and the first to fourth masking clocks MS_ICLK, MS_QCLK, MS_ICLKB and MS_QCLKB, in the semiconductor device 100 in accordance with an embodiment will be described below with reference to FIG. 12.

The first masking clock MS_ICLK is enabled to the logic high level from a time T31 to a time T36. The period from the time T31 to the time T36 in which the first masking clock MS_ICLK is enabled is set to be the same as the period from the time T1 to the time T10 described above with reference to FIG. 7.

The first mixing circuit 210 generates the first strobe signal DQS<1> which includes a first pulse, a second pulse and a third pulse, by buffering the first internal clock ICLK during the period from the time T31 to the time T36 in which the first masking clock MS_ICLK is enabled to the logic high level.

The second masking clock MS_QCLK is enabled to the logic high level from a time T34 to a time T37. The period from the time T34 to the time T37 in which the second masking clock MS_QCLK is enabled is set to be the same as the period from the time T5 to the time T11 described above with reference to FIG. 7.

The second mixing circuit 220 generates the second strobe signal DQS<2> which includes a first pulse and a second pulse, by buffering the second internal clock QCLK during the period from the time T34 to the time T37 in which the second masking clock MS_QCLK is enabled to the logic high level.

The third masking clock MS_ICLKB is enabled to the logic high level from a time T35 to a time T38. The period from the time T35 to the time T38 in which the third masking clock MS_ICLKB is enabled is set to be the same as the period from the time T6 to the time T12 described above with reference to FIG. 7.

The third mixing circuit 230 generates the third strobe signal DQS<3> which includes a first pulse and a second pulse, by buffering the third internal clock ICLKB during the period from the time T35 to the time T38 in which the third masking clock MS_ICLKB is enabled to the logic high level.

The fourth masking clock MS_QCLKB is enabled to the logic high level from a time T33 to a time T39. The period from the time T33 to the time T39 in which the fourth masking clock MS_QCLKB is enabled is set to be the same as the period from the time T3 to the time T13 described above with reference to FIG. 7.

The fourth mixing circuit 240 generates the fourth strobe signal DQS<4> which includes a first pulse, a second pulse and a third pulse, by buffering the fourth internal clock QCLKB during the period from the time T33 to the time T39 in which the fourth masking clock MS_QCLKB is enabled to the logic high level.

The first signal transfer circuit 31 generates the first to fourth transfer strobe signals TDQS<1:4> by amplifying the first to fourth strobe signals DQS<1:4> through at least one repeater.

The first internal strobe signal generation circuit 43 generates the first internal strobe signal IDQS<1>, which toggles from a time T32 to the time T38, by mixing the first to fourth transfer strobe signals TDQS<1:4>. A second preamble period P2 is set from the time T32 to the time T35. In the second preamble period P2, the first internal strobe signal IDQS<1> retains the logic high level H from the time T32 to the time T34 and then toggles to the logic low level L at the time T34. The second preamble period P2 is set to two cycles of the clock CLK.

As is apparent from the above descriptions, in a semiconductor device in accordance with embodiments disclosed herein and configured as mentioned above, a strobe signal may be generated from an internal clock during the enable period of a masking clock, and the strobe signal may be outputted through a plurality of repeaters to a pad. As a consequence, it may be possible to generate a stable strobe signal even with a change in PVT.

Figure 13:
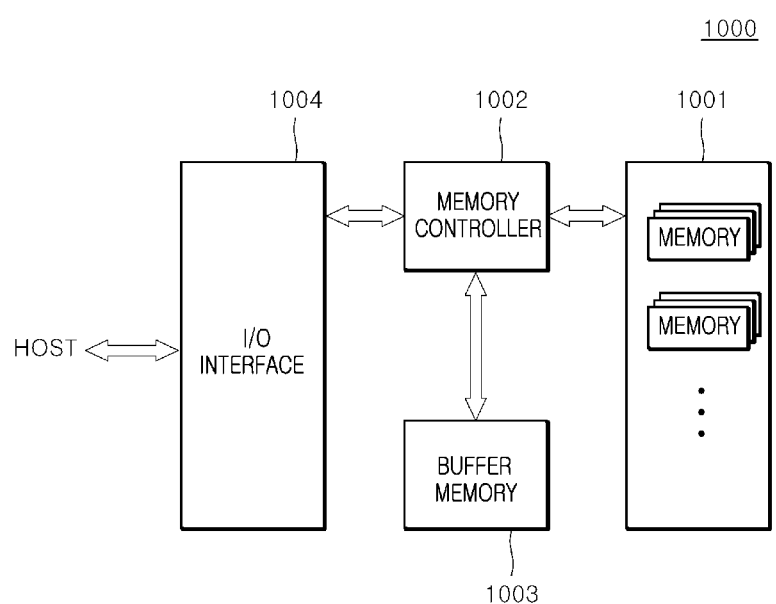
FIG. 13 is a diagram illustrating a representation of an example of a configuration of an electronic system to which semiconductor devices illustrated in FIGS. 1 to 12 may be applied.

The semiconductor devices described above and with reference to FIGS. 1 to 12 may be applied to an electronic system which includes a memory system, a graphic system, a computing system or a mobile system. For example, referring to FIG. 13, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 13, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory). The buffer memory 1003 may include the semiconductor device illustrated in FIG. 1.

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device described herein should not be limited based on the described embodiments.

What is claimed is:
1. A semiconductor device comprising:
a control circuit configured to receive a clock and generate a first to fourth internal clocks, and to generate a first to fourth masking clocks from a latency signal in synchronization with the first internal clock and the second internal clock in accordance with a mode signal; and a signal mixing circuit configured to output the first to fourth internal clocks as a first to fourth strobe signals during respective enable periods of the first to fourth masking clocks, wherein each of the first to fourth internal clocks have a different phase.

2. The semiconductor device according to claim 1, wherein the mode signal is a signal used to set a first and a second preamble period of an internal strobe signal, and wherein the first preamble period is set to one cycle of the clock, and the second preamble period is set to two cycles of the clock.

3. The semiconductor device according to claim 1, wherein the control circuit comprises:

an internal clock generation circuit configured to receive the clock and to generate the first to fourth internal clocks; and a masking clock generation circuit configured to generate the first to fourth masking clocks from the latency signal in synchronization with the first internal clock and the second internal clock in accordance with the mode signal.

4. The semiconductor device according to claim 3, wherein the masking clock generation circuit comprises:

a first latch circuit configured to latch the latency signal in synchronization with the first internal clock, shift the latched latency signal, and generate a first latch signal and a first to third masking signals;

a second latch circuit configured to latch the first masking signal in synchronization with the second internal clock, shift the latched first masking signal, and generate a fourth to sixth masking signals; and a logic circuit configured to generate the first to fourth masking clocks from the first latch signal and the first to sixth masking signals and in accordance with the mode signal and the latency signal.

5. The semiconductor device according to claim 1, wherein the signal mixing circuit comprises:

a first mixing circuit configured to output the first internal clock as the first strobe signal during the enable period of the first masking clock;

a second mixing circuit configured to output the second internal clock as the second strobe signal during the enable period of the second masking clock;

a third mixing circuit configured to output the third internal clock as the third strobe signal during the enable period of the third masking clock; and a fourth mixing circuit configured to output the fourth internal clock as the fourth strobe signal during the enable period of the fourth masking clock.

6. The semiconductor device according to claim 1, further comprising:

a signal transfer circuit including at least one repeater for amplifying the first to fourth strobe signals and generating a first to fourth transfer strobe signals through the at least one repeater, and configured to transmit the first to fourth transfer strobe signals to a pad; and a bank configured to generate an internal strobe signal from the first to fourth transfer strobe signals, and to input and output data in synchronization with the internal strobe signal.

7. The semiconductor device according to claim 6, wherein the signal transfer circuit comprises:

a buffer circuit configured to buffer the first to fourth strobe signals and generate the first to fourth transfer strobe signals;

a first repeater configured to amplify and transmit the first to fourth transfer strobe signals; and a second repeater configured to amplify the first to fourth transfer strobe signals outputted from the first repeater, and to transmit the first to fourth transfer strobe signals outputted from the second repeater to the pad.

8. The semiconductor device according to claim 7, wherein the buffer circuit comprises:

a first transfer circuit configured to generate the first transfer strobe signal by buffering the first strobe signal based on a ground voltage;

a second transfer circuit configured to generate the second transfer strobe signal by buffering the second strobe signal based on the ground voltage;

a third transfer circuit configured to generate the third transfer strobe signal by buffering the third strobe signal based on the ground voltage; and a fourth transfer circuit configured to generate the fourth transfer strobe signal by buffering the fourth strobe signal based on the ground voltage.

9. The semiconductor device according to claim 6, wherein the bank comprises:

an internal strobe signal generation circuit configured to generate the internal strobe signal by mixing the first to fourth transfer strobe signals received from the pad;

a memory region configured to store an internal data in a write operation, and to output the internal data in a read operation; and an input and output circuit configured to input and output the internal data in synchronization with the internal strobe signal.

10. The semiconductor device according to claim 1, further comprising:

a signal transfer circuit configured to transmit the first to fourth strobe signals to a first pad and a second pad, the signal transfer circuit including at least one repeater which amplifies and transmits the first to fourth strobe signals.

11. The semiconductor device according to claim 10, wherein the first pad and the second pad are included in different banks, and an amount by which the first to fourth strobe signals to be transmitted to the first pad are amplified and an amount by which the first to fourth strobe signals to be transmitted to the second pad are amplified are set to be different from each other, depending on lengths of paths through which the first to fourth strobe signals are to be transmitted.

12. The semiconductor device according to claim 10, wherein the signal transfer circuit comprises:

a first signal transfer circuit configured to generate a first to fourth transfer strobe signals by amplifying the first to fourth strobe signals, and to transmit the first to fourth transfer strobe signals to the first pad; and a second signal transfer circuit configured to generate a fifth to eighth transfer strobe signals by amplifying the first to fourth transfer strobe signals, and to transmit the fifth to eighth transfer strobe signals to the second pad.

13. The semiconductor device according to claim 12, wherein the first signal transfer circuit comprises:

a first buffer circuit configured to buffer the first to fourth strobe signals and generate the first to fourth transfer strobe signals;

a first repeater configured to amplify and transmit the first to fourth transfer strobe signals; and a second repeater configured to amplify the first to fourth transfer strobe signals outputted from the first repeater, and to transmit the first to fourth transfer strobe signals outputted from the second repeater to the first pad.

14. The semiconductor device according to claim 13, wherein the first buffer circuit comprises:
   a first transfer circuit configured to generate the first transfer strobe signal by buffering the first strobe signal based on a ground voltage;
   a second transfer circuit configured to generate the second transfer strobe signal by buffering the second strobe signal based on the ground voltage;
   a third transfer circuit configured to generate the third transfer strobe signal by buffering the third strobe signal based on the ground voltage; and
   a fourth transfer circuit configured to generate the fourth transfer strobe signal by buffering the fourth strobe signal based on the ground voltage.

15. The semiconductor device according to claim 12, wherein the second signal transfer circuit comprises:
   a second buffer circuit configured to buffer the first to fourth transfer strobe signals and generate the fifth to eighth transfer strobe signals;
   a third repeater configured to amplify and transmit the fifth to eighth transfer strobe signals; and
   a fourth repeater configured to amplify the fifth to eighth transfer strobe signals outputted from the third repeater, and transmit the fifth to eighth transfer strobe signals outputted from the fourth repeater to the second pad.

16. The semiconductor device according to claim 15, wherein the second buffer circuit comprises:
   a fifth transfer circuit configured to generate the fifth transfer strobe signal by buffering the first transfer strobe signal based on a ground voltage;
   a sixth transfer circuit configured to generate the sixth transfer strobe signal by buffering the second transfer strobe signal based on the ground voltage;
   a seventh transfer circuit configured to generate the seventh transfer strobe signal by buffering the third transfer strobe signal based on the ground voltage; and
   an eighth transfer circuit configured to generate the eighth transfer strobe signal by buffering the fourth transfer strobe signal based on the ground voltage.

17. A semiconductor device comprising:
   a signal mixing circuit configured to output first to fourth internal clocks, which have different phases, as first to fourth strobe signals, during enable periods of first to fourth masking clocks; and
   a signal transfer circuit configured to transmit the first to fourth strobe signals to a first pad and a second pad, wherein the first to fourth strobe signals to be transmitted to the first pad are amplified by a first amplification amount, and the first to fourth strobe signals to be transmitted to the second pad are amplified by a second amplification amount.

18. The semiconductor device according to claim 17, wherein the second amplification amount is set to be larger than the first amplification amount.

19. The semiconductor device according to claim 17, wherein a transmission length through which the first to fourth strobe signals are transmitted through the first pad is set as a first transmission length, a transmission length through which the first to fourth strobe signals are transmitted through the second pad is set as a second transmission length, and the second transmission length is set to be longer than the first transmission length.

20. The semiconductor device according to claim 17, wherein the signal transfer circuit comprises:
   a first signal transfer circuit including first and second repeaters, and configured to generate first to fourth transfer strobe signals by amplifying the first to fourth strobe signals by the first amplification amount, and transmit the first to fourth transfer strobe signals to the first pad; and
   a second signal transfer circuit including third and fourth repeaters, and configured to generate fifth to eighth transfer strobe signals by amplifying the first to fourth transfer strobe signals by the second amplification amount, and transmit the fifth to eighth transfer strobe signals to the second pad.

* * * * *